(12) United States Patent
Nagaraj

(10) Patent No.: US 6,529,070 B1
(45) Date of Patent: Mar. 4, 2003

(54) LOW-VOLTAGE, BROADBAND OPERATIONAL AMPLIFIER

(75) Inventor: Krishnasawamy Nagaraj, Somerville, NJ (US)

(73) Assignee: Texas Instruments Incorporated, Dallas, TX (US)

(*) Notice: Subject to any disclaimer, the term of this patent is extended or adjusted under 35 U.S.C. 154(b) by 54 days.

(21) Appl. No.: 09/655,697

(22) Filed: Sep. 6, 2000

Related U.S. Application Data

(60) Provisional application No. 60/161,282, filed on Oct. 25, 1999.

(51) Int. Cl.[7] .............................. H03F 1/02; H03F 3/45
(52) U.S. Cl. ........................... 330/9; 330/253; 330/258
(58) Field of Search .............................. 330/9, 253, 258

(56) References Cited

U.S. PATENT DOCUMENTS

| | | | | |
|---|---|---|---|---|
| 5,568,091 A | * | 10/1996 | Ramalho et al. | 330/258 |
| 5,847,600 A | * | 12/1998 | Brooks et al. | 330/9 |
| 5,856,757 A | * | 1/1999 | Eschauzier | 330/258 |
| 5,914,638 A | * | 6/1999 | He | 330/258 |

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

A low voltage, broadband differential operational amplifier which eliminates the long tail current source from the amplifier, thereby relieving the headroom requirements by a few tenths of a volt. An input common mode feedback circuit is used to overcome the problems arising from the removal of the long tail current source of prior art circuits. This circuit monitors the common mode feedback current and when the value of the current exceeds a specified range around the nominal amplifier bias current, an appropriate correction in the common mode input voltage is made. This novel amplifier will be valuable for use in pipelined analog-to-digital converter applications, as well as many other low voltage and/or portable applications.

4 Claims, 4 Drawing Sheets

LOW-VOLTAGE, BROADBAND OPERATIONAL AMPLIFIER

This application claims priority under 35 USC §119(e)(1) of provisional application No. 60/161,282 filed Oct. 25, 1999.

BACKGROUND OF THE INVENTION

1. Field of the Invention

This invention relates to the field of electronic circuits associated with operational amplifiers (op-amps) and in particular to low-voltage versions of these circuits suitable for use in various pipelined analog-to-digital converter and/or other portable applications.

2. Brief Description of the Known Art

FIG. 1 shows a schematic for the well known 'telescopic cascode' amplifier. A bandwidth of 500 MHz and a dc gain of 60 dB is achievable with this type circuit. This differential op-amp is comprised of cascoded n-channel input transistors 1, 3 and 2, 4 at the $V_{ip}$ and $V_{in}$ inputs, respectively, along with the long tail current source transistor 5. P-channel transistors 6–9 act as an active load. The common mode adjust circuitry 10 is used to compensate for a mismatch between tail current and the bias current by providing a common mode feedback (CMFB) signal to the gates of transistors 8 and 9. The differential outputs $V_{Op}$ and $V_{On}$ for the circuit are taken from the drains of n-channel transistors 3 and 4, respectively. Because this amplifier is known to have a minimum number of non-dominant poles, the circuit has excellent bandwidth properties. This is primarily due to the following:

1) the p-channel transistors 6–9 in the circuit do not carry any signal current. Thus, all capacitances associated with p-channel transistors 8 and 9, as well as the gate-source and source-substrate capacitances of p-channel transistors 6 and 7 do not contribute any poles;

2) since the main non-dominant poles are contributed by the n-channel transistors, which can be kept small in size by tailoring their W/L layout for a given transconductance, the resulting poles will generally be at higher frequencies;

3) the large capacitance often associated with a folded cascode amplifier, where three transistors have to 'meet' at the folding node, is not present in this telescopic cascode amplifier.

The main problem with this conventional cascode operational amplifier circuit is that of low voltage headroom. Because so many transistors are stacked, it is difficult to realize this circuit when working at voltages as low as 2.5 volts or less.

A number of patents may be of interest in relation to the technology discussed above and in this patent, including but not limited to the following: U.S. Pat. No. 5,798,673 Low voltage operational amplifier bias current and method. U.S. Pat. No. 5,734,296 Low voltage operational amplifier input stage and method.

SUMMARY OF THE INVENTION

A new differential, low voltage, broadband operational amplifier which eliminates the long tail current source from the amplifier, thereby relieving the low voltage headroom requirements, is disclosed. This advantage will allow the amplifier to operate from a power supply of less than 2.5 volts.

The circuitry of this invention compensates for the significant changes in drain current in the input transistors of the amplifier by monitoring the current in a common mode feedback signal. When the value of this current exceeds a specified range around the nominal amplifier bias current, an appropriate correction is made to the common mode input voltage. Using this circuitry which can be implemented with minimal chip area and negligible power consumption, an operational amplifier is built without a long tail current source that operates at voltages of 2.5 volts or less.

Two implementations for the control loop for common mode input voltage are discussed, although other implementations are possible. Simulated results for both a conventional amplifier and the operational amplifier of this invention, both running from a power supply of less than 2.5 volts, are compared.

DESCRIPTION OF THE PREFERRED EMBODIMENT

Figure 1:
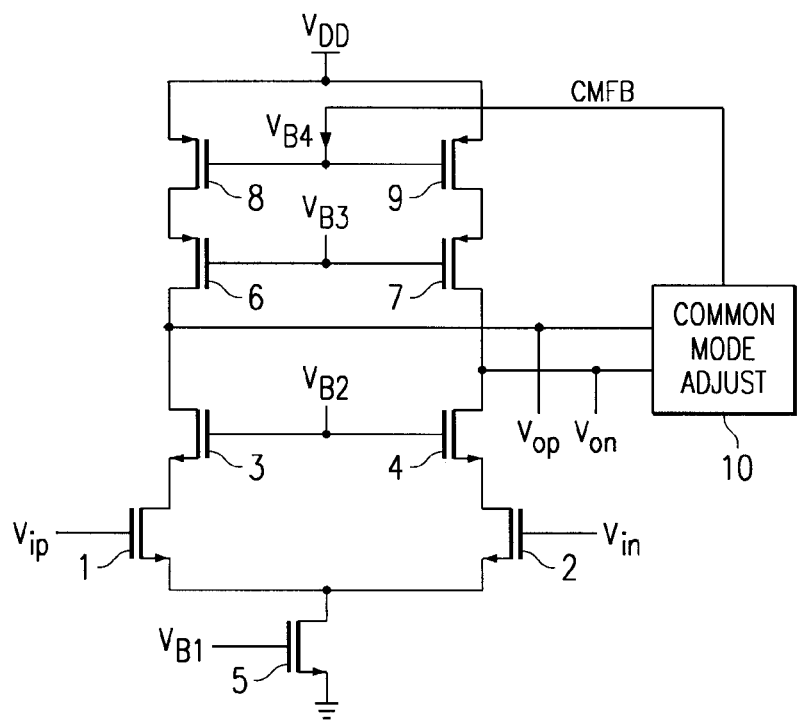
FIG. 1 shows a circuit diagram for a conventional telescopic cascode operational amplifier. (prior art)
Figure 2:
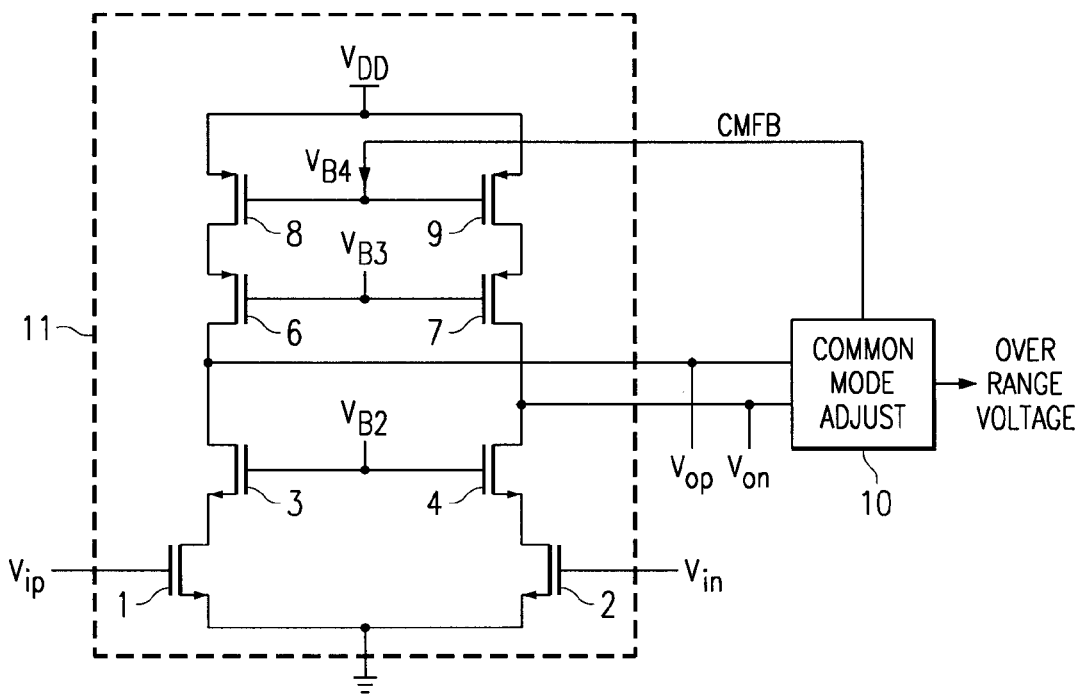
FIG. 2 depicts the schematic for a first embodiment of the modified telescopic cascode operational amplifier of this invention.

FIG. 2 is a schematic for a first embodiment of the modified operational amplifier circuit 11 with common mode adjust circuitry 10, which addresses the low voltage headroom problem discussed in the earlier prior art discussion. Here, the long tail current source 5 (in FIG. 1) has been eliminated completely, taking away the common mode rejection properties of the amplifier. As in FIG. 1, this differential op-amp is comprised of cascoded n-channel input transistors 1,3 and 2,4 at the $V_{ip}$ and $V_{in}$ inputs, respectively, but with the long tail current source transistor 5 (FIG. 1) eliminated. P-channel transistors 6–9 act as an active load. The common mode adjust circuitry 10 is used to compensate for any change in the common mode input voltage of the operational amplifier 11. As before, the differential outputs $V_{op}$ and $V_{on}$ for the circuit are taken from the drains of n-channel transistors 3 and 4, respectively. As long as the common mode input voltage ($V_{CMI}$ in FIG. 3a) is kept equal to or appoximately equal to one transistor $V_{GS}$ drop, this circuit can still be used as an operational amplifier. There are a number of applications where this circuit can be used, for example a fully differential switched-capacitor circuit often used in pipelined analog-to-digital converters, where there is little need for a high common-mode-rejection-ratio (CMRR) since all inputs and outputs are referenced to highly regulated internal bias voltages. This circuit requires a headroom which is 0.3 V to 0.5 V smaller than the conventional long tail operational amplifier circuit of FIG. 1. However, in a general sense, if the input common mode voltage is different from the desired value, the drain current of input transistors 1 and 2 can exhibit large variations from their nominal values. One simple solution to this problem is to increase the range of the output common mode adjustment circuitry 10 such that the current in transistors 8 and 9 can accommodate the current variation in input transistors 1 and 2 and make the necessary corrections. However, this can result in large undesirable variations in the amplifier bandwidth, making it desirable to have a more sophisticated, higher performance approach to the common mode input voltage correction problem.

Figure 3A:
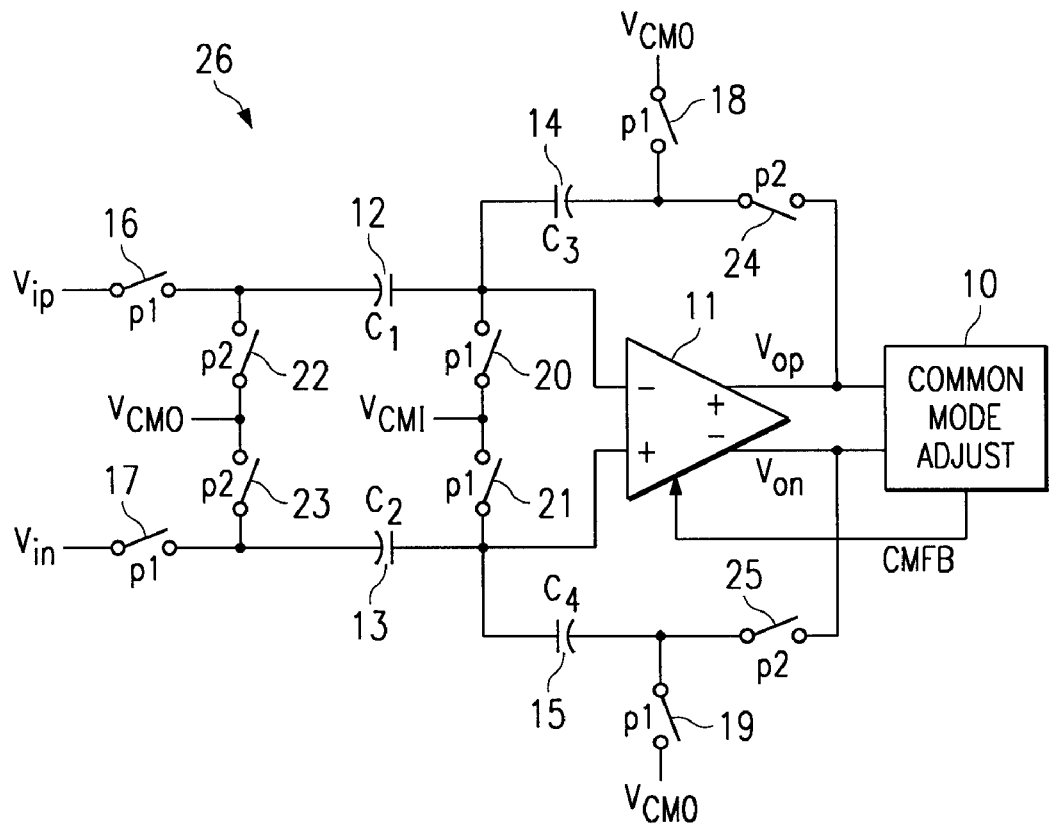
FIGS. 3a and 3b is the schematic and clock cycle, respectively, for a typical switched capacitor amplifier using the operational amplifier of FIG. 2.
Figure 3B:
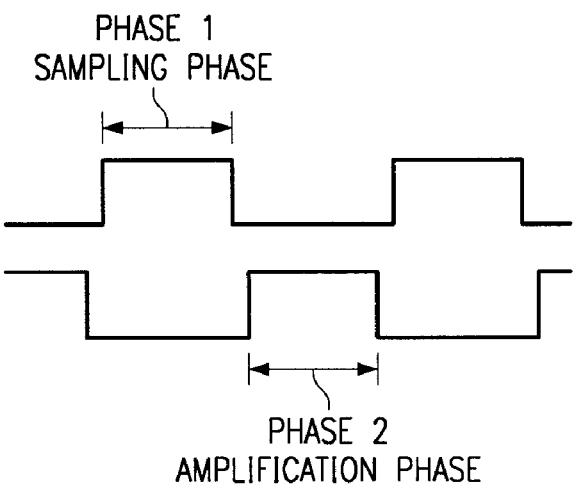

FIG. 3a is a schematic diagram for a switched-capacitor amplifier using the operational amplifier of the first embodiment of this invention. This circuit is chosen to illustrate the reasons why the common mode input voltage, $V_{CMI}$, changes. The circuit is comprised of the operational amplifier 11 of this invention, common mode adjust circuitry 10, four switched capacitors 12–15, phase 1 switches 16–21, and phase 2 switches 22–25, and has differential inputs $V_{ip}$ and $V_{in}$ and differential outputs $V_{op}$ and $V_{on}$. A clock cycle, consisting of phase 1 ($P_1$) sampling phase and phase 2 ($P_2$) amplification phase, for the circuit is shown in FIG. 3b. The operation of the circuit is as follows. During phase 1, when $P_1$ switches 16–21 are closed, the top plates of all capacitors 12–15 ($C_1$–$C_4$) are connected to the input common mode voltage $V_{CMI}$, whereas the bottom plates of capacitors 12 and 13 ($C_1$ and $C_2$) are connected to $V_{ip}$ and $V_{in}$, respectively, and the bottom plates of capacitors 14 and 15 ($C_3$ and $C_4$) are connected to the output common mode voltage $V_{CMO}$. Ideally, the common voltage of $V_{ip}$ and $V_{in}$ would be the same as $V_{CMO}$, as a result of the common mode feedback circuit of the previous stage. Then during phase 2, the bottom plates of capacitors 14 and 15 ($C_3$ and $C_4$) are connected to outputs $V_{op}$ and $V_{on}$, respectively, while the bottom plates of capacitors 12 and 13 ($C_1$ and $C_2$) are connected to $V_{CMO}$. Again, under ideal conditions, the common mode voltage at the amplifier input would be unchanged from phase 1 to phase 2. However, in practice the common mode voltages of $V_{ip}$, $V_{in}$ and $V_{op}$, $V_{on}$ are different from $V_{CMO}$ due to the non-idealities in the common mode feedback circuit of the preceding stage. This results in a change in the common mode input voltage of the amplifier during phase 2.

Another possible source of error is that of signal feedthrough from the switches that are used for connecting the amplifier input nodes to $V_{CMI}$ during phase 1. This can result in a change in the input common mode voltage $V_{CMI}$ during phase 2. The combination of all these error sources can cause the common mode input voltage to change on the order of several tens of millivolts, which in turn can cause the drain current in input transistors 1 and 2 to change by as much as 25%, or more.

Figure 4A:
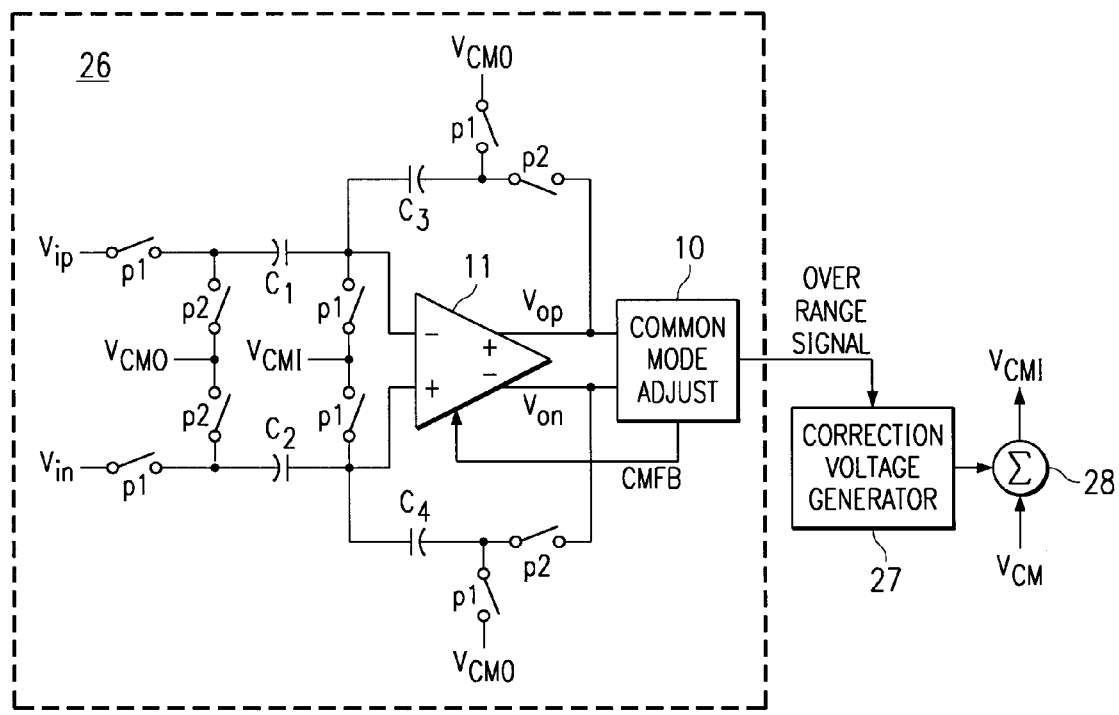
FIGS. 4a and 4b are block diagrams for the common mode input voltage correction technique used with the operational amplifier of this invention in both (a) the switched capacitor and (b) other general applications.
Figure 4B:
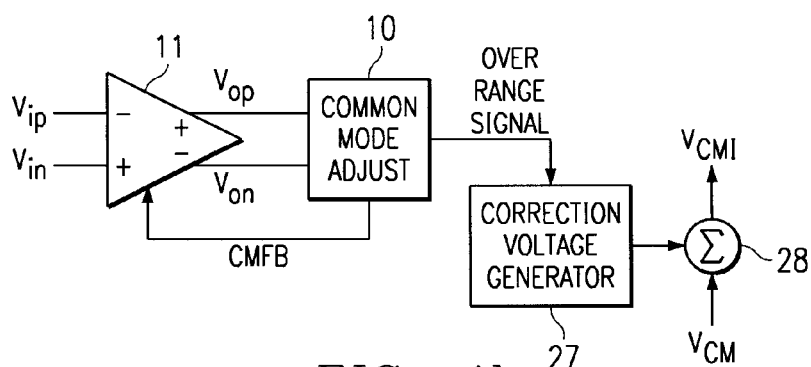

FIG. 4 shows the method for correcting the common mode input voltage variations for this embodiment of the invention. FIG. 4a illustrates this input common mode correction for the switched-capacitor amplifier 26 application discussed earlier, while FIG. 4b shows this correction for a general-case amplifier application. In both cases (FIG. 4a and FIG. 4b) the amount of current supplied to amplifier 11 by the common mode feedback (CMFB) signal is monitored inside the common mode adjust circuit 10. Whenever this current exceeds a certain range, say ±10% of the nominal amplifier bias current, an over-range or under-range signal is generated by the common mode adjust circuitry 10. This is then used to apply a suitable correction to the $V_{CMI}$ voltage by means of a correction voltage generator 27 and summing circuit 28. This second correction feedback loop must be made slower that the main CMFB loop in order to avoid any signal 'chatter'.

Figure 5A:
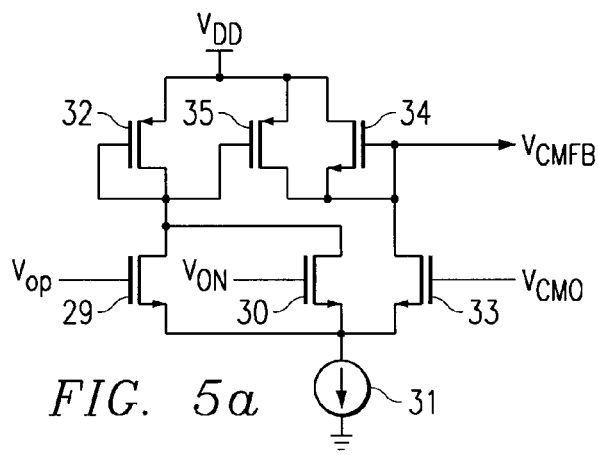
FIGS. 5a, 5b, and 5c are schematic diagrams for a first implementation of the common mode voltage correction technique of FIG. 4.

A first technique for correcting the common mode input voltage variations of this invention is shown in FIG. 5. FIG. 5a shows the common mode feedback circuit which generates the $V_{CMFB}$ signal. This circuit is comprised on one side of two n-channel transistors 29–30 for input signals $V_{OP}$ and $V_{ON}$, respectively, a current source 31, and a diode connected p-channel transistor 32. The other side of the circuit is comprised of a n-channel transistor 33 for the $V_{CMO}$ input signal, a diode connected n-channel transistor 34, and the same current source 31. Another p-channel transistor 35 couples the two sides of the circuit together. The inputs to the circuit are $V_{OP}$, $V_{ON}$, and $V_{CMO}$ and the output is $V_{CMFB}$.

Figure 5B:
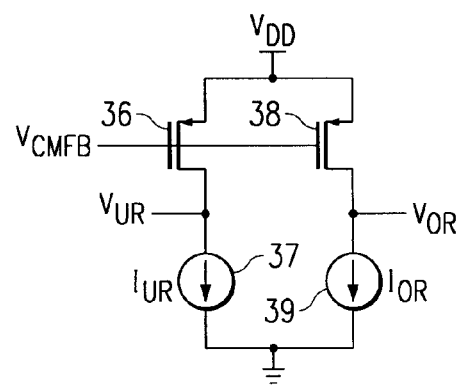

The circuit of FIG. 5b consists of two current mirrors, each comprised of a p-channel transistor 36 and/or 38 and a current source 37 and/or 39. This circuit monitors the $V_{CMFB}$ signal and generates two replicas of the common mode current supplied to the main amplifier. These currents are then compared with a lower current limit $I_{UR}$ and a higher current limit $I_{OR}$, flowing in constant current sources 37 and 39, respectively. If the current in the $I_{OR}$ leg of the circuit exceeds the constant current $I_{OR}$, then the $V_{OR}$ output signal will go high (UP). Likewise, if the current in the $I_{UR}$ leg of the circuit is less than the constant current $I_{UR}$, then the $V_{UR}$ output signal will go low (DOWN).

Figure 5C:
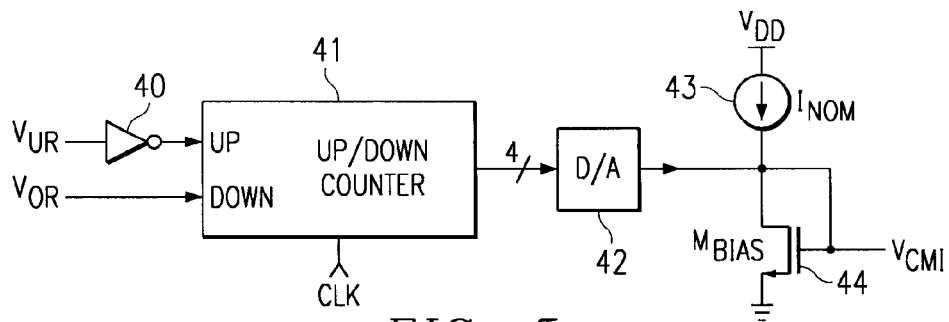

These $V_{OR}$ and $V_{UR}$ signals are then fed into the correction circuitry of FIG. 5c. In this circuit, the $V_{UR}$ signal is complemented by means of an inverter 40 and fed into the UP input of an UP/DOWN counter 41, while the $V_{OR}$ signal is feed into the DOWN input of the same UP/DOWN counter 41. The counter 41 drives a low resolution (3-to-4 bits) digital-to-analog (D/A) converter 42 which generates a small correction current that is added to or subtracted from the current flowing in current source 43, which represents the nominal amplifier bias current. This total current is fed into a diode connected n-channel ($M_{BIAS}$) transistor 44 that is matched with the input transistors 1 and 2 of the main amplifier 11, shown in FIG. 2. In operation, the operational amplifier's output signals $V_{OP}$ and $V_{ON}$ are compared with the common mode output voltage $V_{CMO}$ and an appropriate common mode feedback signal $V_{CMFB}$ is generated. Any change in the $V_{CMFB}$ signal is reflected at the output of the current mirrors as an increase or decrease in the $V_{OR}$ and $V_{UR}$ signals, respectively. These $V_{OR}$ and $V_{UR}$ signals are then used to make the counter count clock pulsed either UP or DOWN. Finally, the output of the counter is converted back to an analog current and is added to or subtracted from the amplifier's nominal current and used to adjust the $V_{CMI}$ voltage, such as to maintain common mode between the operational amplifier's input and output signals. In practice, the circuitry associated with this correction implementation can be realized with a small amount of extra chip area and a negligible amount of power. The combination of the UP/DOWN counter and D/A converter can also be implemented using a charge pump and a capacitor.

Figure 6:
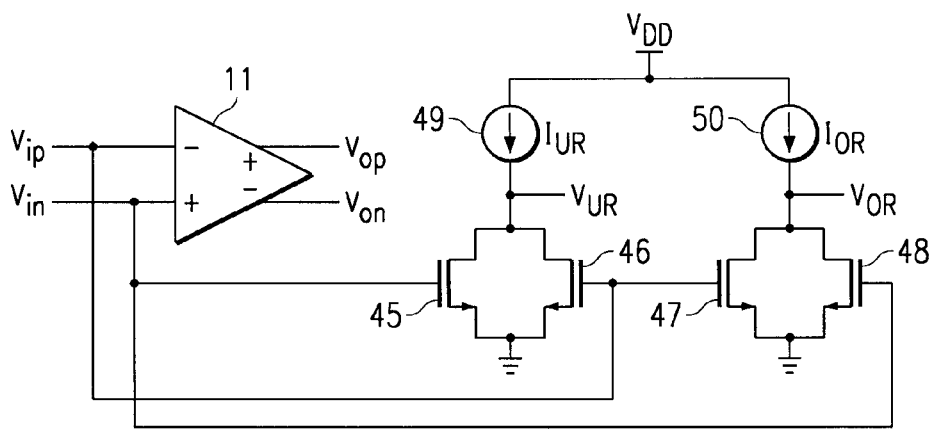
FIG. 6 is a schematic diagram for a second implementation of the common mode input voltage correction technique of FIG. 4.

A second technique for implementing the control loop for the common mode input voltage correction of this invention is shown in FIG. 6. Here, the combinations of two n-channel transistors pairs 45–46 and 47–48 are used to replicate the current flowing in the input transistors 1 and 2 of the main amplifier 11. These are compared with reference currents $I_{UR}$, which is slightly smaller than the nominal current, and $I_{OR}$, which is slightly larger than the nominal current, that is flowing in the $I_{UR}$ current source 49 and the $I_{OR}$ current source 50, respectively. If the replicated current is outside of the established window for the $I_{UR}$ and $I_{OR}$ currents, a correction is applied to the $V_{CMI}$ using the same UP/DOWN counter circuit of FIG. 5c.

Figure 7:
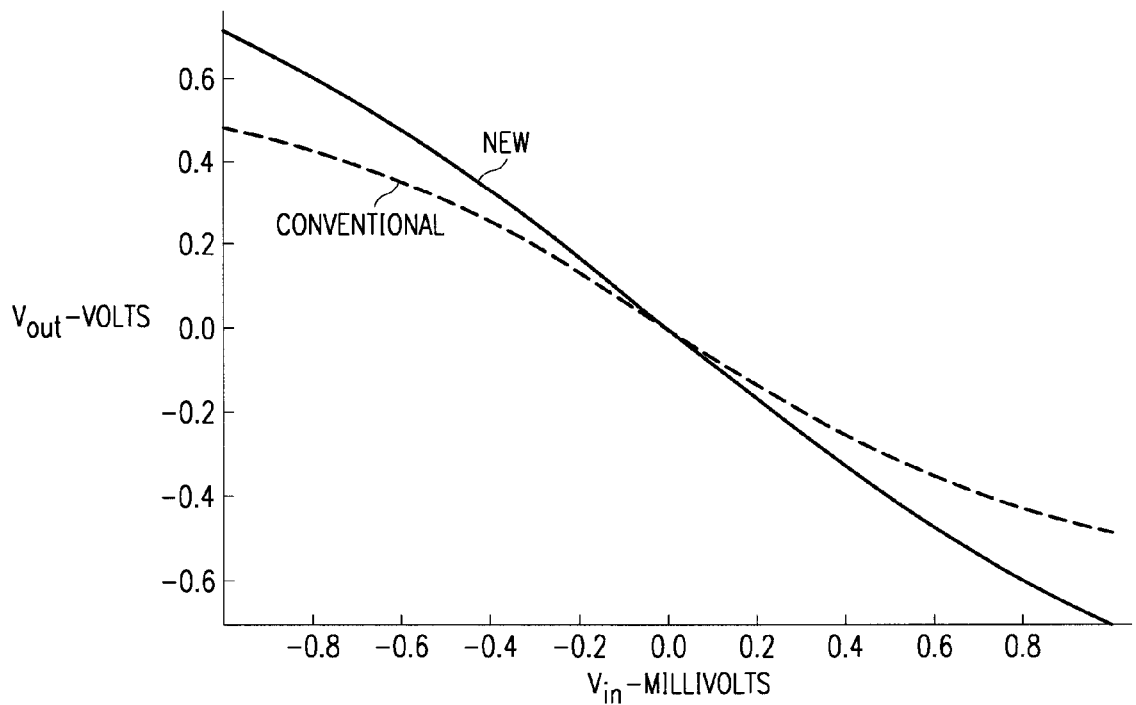
FIG. 7 compares simulation results for the operational amplifier of this invention and for a conventional cascode operational amplifier, both running from a 2.5 volt power supply.

FIG. 7 compares the simulation results for both a conventional operational amplifier and the new operational amplifier of this patent, both running from a 2.5 volt power supply. As shown, for a given input signal, a several tenths of volt improvement in the output amplitude is realized, making it a desired circuit for low voltage applications.

While this invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A low-voltage, broadband, differential operational amplifier comprising:

a differential cascoded input transistor pair coupled to first and second input signals;

active transistor loads for each said input transistor; and a common mode adjust circuit, wherein the source of said input transistors are coupled directly to a supply voltage thereby eliminating a long tail current source;

said amplifier's supply voltage being less than 2.5 volts, a first differential input coupled to the gate of a first n-channel transistor;

a second differential input coupled to the gate of a second n-channel transistor;

the sources of said first and second n-channel transistors connected together and coupled to a first supply voltage;

the drain of said first n-channel transistor coupled to the source of a third n-channel transistor;

the drain of said second n-channel transistor coupled to the source of a fourth n-channel transistor;

the gates of said third and fourth n-channel transistors connected together and coupled to a first common mode control input;

the drain of said third n-channel transistor coupled to the drain of a first p-channel transistor, to the first input of said common mode adjust circuit, and to the first differential signal output;

the drain of said fourth n-channel transistor coupled to the drain of a second p-channel transistor, to the second input of said common mode adjust circuit, and to the second differential signal output;

the gates of said first and second p-channel transistors connected together and coupled to the second common mode control input;

the source of said first p-channel transistor coupled to the drain of a third p-channel transistor;

the source of said second p-channel transistor coupled to the drain of a fourth p-channel transistor;

the gates of said third and fourth p-channel transistors connected together and coupled the first output of said common mode adjust circuit;

the sources of said third and fourth p-channel connected together and coupled to a second supply voltage; and a second output of said common mode circuit providing an over-range voltage output signal.

2. The operational amplifier of claim 1, further comprising:

a correction voltage generator circuit; and a summing amplifier circuit, whereby: the common mode feedback signal is monitored;

said common mode feedback signal is compared to a specified range around said amplifier's nominal bias current;

an out-of-range error signal is generated when the feedback current is above or below said specified range; and an appropriate correction is made to said amplifier's common mode input voltage when said specified range is exceeded.

3. The operational amplifier of claim 2, wherein:

the input to said correction voltage generator is coupled to an output of said common mode adjust circuit;

the output of said correction voltage generator is coupled to the first input of said summing amplifier;

the second input to said summing amplifier is coupled to a common mode voltage; and the output of said summing amplifier provides the corrected common mode input voltage to said operational amplifier.

4. A switched capacitor operational amplifier, comprising:

a differential cascoded input transistor pair coupled to first and second input signals;

active transistor loads for each said input transistor;

a common mode adjust circuit;

a common mode input voltage correction generator; with the sources of said input transistors coupled directly to a supply voltage thereby eliminating a long tail current source, said first differential input signal coupled to the input of a first phase one switch;

said second differential input signal coupled to the input of a second phase one switch;

the output of said first phase one switch coupled to the input of a first phase two switch and to the bottom plate of a first capacitor;

the output of said second phase one switch coupled to the input of a second phase two switch and to the bottom plate of a second capacitor;

the outputs of said first and second phase one switches connected together and coupled to the common mode output voltage;

the top plate of said first capacitor coupled to top plate of a third capacitor, to the input of a third phase one switch, and to the negative input of said operational amplifier;

the top plate of said second capacitor coupled to the top plate of a fourth capacitor, to the input of a fourth phase one switch, and to the positive input of said operational amplifier;

the outputs of said third and fourth phase one switches connected together and coupled to the input common mode voltage;

the bottom plate of said third capacitor coupled to input of a third phase two switch and to the input of a fifth phase one switch;

the bottom plate of said fourth capacitor coupled to input of a fourth phase two switch and to the input of a sixth phase one switch;

the output of said fifth and sixth phase one switches coupled to the output common mode voltage;

the positive differential output of said operational amplifier coupled to the output of said third phase two switch and to the first input of common mode adjust circuit;

the negative differential output of said operational amplifier coupled to the output of said fourth phase two switch and to the second input of said common mode adjust circuit;

the first output of said common mode adjust circuit coupled to the third input of said operational amplifier;

the second output of said common mode adjust circuit providing an over range voltage used for the common mode correction.

* * * * *